United States Patent
Lopez et al.

(10) Patent No.: US 7,312,620 B2
(45) Date of Patent: Dec. 25, 2007

(54) BURN-IN TESTING APPARATUS AND METHOD

(75) Inventors: Christopher A. Lopez, Phoenix, AZ (US); Brian J. Denheyer, Portland, OR (US); Gordon B. Kuenster, Mednia, WA (US)

(73) Assignee: Wells-CTI, LLC, Vancouver, WA (US)

( * ) Notice: Subject to any disclaimer, the term of this patent is extended or adjusted under 35 U.S.C. 154(b) by 0 days.

(21) Appl. No.: 11/562,294

(22) Filed: Nov. 21, 2006

(65) Prior Publication Data
US 2007/0075721 A1    Apr. 5, 2007

Related U.S. Application Data

(63) Continuation of application No. 11/367,983, filed on Mar. 3, 2006, now Pat. No. 7,187,189, which is a continuation of application No. 11/069,589, filed on Feb. 28, 2005, now Pat. No. 7,042,240, which is a continuation-in-part of application No. 10/920,531, filed on Aug. 17, 2004, now Pat. No. 7,123,037.

(60) Provisional application No. 60/548,303, filed on Feb. 27, 2004.

(51) Int. Cl.
*G01R 31/02* (2006.01)
(52) U.S. Cl. ............................................. 324/760
(58) Field of Classification Search .................. None
See application file for complete search history.

(56) References Cited

U.S. PATENT DOCUMENTS

| | | | |
|---|---|---|---|
| 4,940,935 A | 7/1990 | Riley | |
| 4,962,356 A | 10/1990 | Eberlein et al. | |
| 5,164,661 A | 11/1992 | Jones | |
| 5,414,370 A | 5/1995 | Hashinaga et al. | |
| 5,420,521 A | 5/1995 | Jones | |
| 5,911,897 A | 6/1999 | Hamilton | |
| 6,191,599 B1 | 2/2001 | Stevens | |
| 6,230,497 B1 | 5/2001 | Morris et al. | |
| 6,362,640 B1 | 3/2002 | Wee | |
| 6,477,047 B1 | 11/2002 | Markwardt et al. | |
| 6,636,062 B2 | 10/2003 | Gaasch et al. | |
| 6,668,570 B2 | 12/2003 | Wall et al. | |

(Continued)

OTHER PUBLICATIONS

TEKMAR—Data Brochure, 10K Sensors, D070 Tekmar Control Systems, Ltd., Canada, pp. 1-4, Nov. 2001.

*Primary Examiner*—Jermele Hollington
(74) *Attorney, Agent, or Firm*—Marger Johnson & McCollom, PC

(57) ABSTRACT

An integrated circuit (IC) package testing apparatus integrates a temperature sensor, heater (or cooler), and controller within a single modular unit. The controller is a microprocessor embedded within the modular unit and in communication with the sensor and heater. The controller allows a selected testing temperature to be input by a user via a communications link to the controller. Each IC package has its testing temperature individually controlled by a controller. The module is easily attached and removed from an open-top socket through the use of latches on the testing socket. Many IC packages can be quickly placed and removed from testing sockets when a matrix of sensors and heaters (or coolers) are located on a single top attach plate with the sensors and heaters (or coolers) individually spring-loaded on the single top attach plate.

16 Claims, 13 Drawing Sheets

U.S. PATENT DOCUMENTS

| | | |
|---|---|---|
| 6,981,882 B1 | 1/2006 | Palaniappa |
| 7,042,240 B2 | 5/2006 | Lopez et al. |
| 7,123,037 B2 | 10/2006 | Lopez |
| 7,187,189 B2 * | 3/2007 | Lopez et al. ................ 324/760 |

* cited by examiner

BURN-IN TESTING APPARATUS AND METHOD

RELATED APPLICATION DATA

This application is a continuation of and commonly assigned U.S. Ser. No. 11/367,983, filed Mar. 3, 2006, now U.S. Pat. No. 7,187,189 which is a continuation of U.S. Ser. No. 11/069,589, filed on Feb. 28, 2005, now U.S. Pat. No. 7,042,240 issued on May 9, 2006, which is a continuation-in-part of U.S. Ser. No. 10/920,531, filed on Aug. 17, 2004, now U.S. Pat. No. 7,123,037 issued on Oct. 17, 2006, and claims the benefit of U.S. Ser. No. 60/548,303, filed on Feb. 27, 2004, the contents of which are herein incorporated by reference in their entirety.

FIELD OF THE INVENTION

This invention relates to integrated circuit testing sockets and, more particularly, to the temperature control of integrated circuits in an integrated circuit testing and/or burn-in socket.

BACKGROUND OF THE INVENTION

Integrated circuit (IC) packages must be tested after their manufacture normally at elevated temperatures, which is typically a burn-in process. During that process, it is often necessary to control the temperature of ICs, sensors, and other elements. Techniques for doing so have been widely practiced for many years. The system normally consists of a heater (or cooler), a temperature sensor, and a comparator which applies energy to a heater in proportion to the difference in voltage measured on the temperature sensor as compared to a reference voltage. The energy is applied in the proper direction to cause the difference voltage to be reduced. Temperature control modules and temperature sensors of many types are widely sold for these purposes. A typical application is the control of the temperature of ICs for a burn-in process because of the temperature sensitivity of the ICs.

To achieve more accurate testing results, it is desirable to control the temperature of each individual IC being tested. Within a testing oven without individual temperature control, the actual temperature of each IC can vary due to different rates of convection, heat dissipation, or radiation within the oven. Individual temperature control can be achieved by sensing the temperature of each IC and varying the heat directed to each IC through the use of individual heaters.

Two such examples of sensing and heating individual ICs can be found in U.S. Pat. No. 5,164,661 to Jones and U.S. Pat. No. 5,911,897 to Hamilton. Both Jones and Hamilton disclose a testing socket with a sensor in direct contact with an IC that senses the temperature of the IC and a heater also in contact with the IC for affecting a change in the temperature of the IC. However, both Jones and Hamilton disclose separated sensors, heaters and controllers that require wiring to connect each sensor to a controller physically separated from the testing socket. Problems can arise during testing, caused by faulty sensors, wires, heaters or a failure of time-phasing between the controller and the sensor and heater. If any of these faults occur, the tester must check each individual component to discover the faulty component.

As shown in FIG. 10, in Hamilton, a temperature sensor 110 is positioned within an insulated sensor housing 112 such that the sensor 110 protrudes from the housing 112 to contact the integrated circuit being tested. The sensor housing 112 is located in an opening in the heat sink 114.

In both Hamilton and Jones, the temperature sensor directly contacts the integrated circuit when the socket is closed. The direct contact between the temperature sensor can cause damage to the integrated circuit because of the point loading of the relatively small temperature sensor on the integrated circuit when the socket is clamped closed. Damage to the temperature sensor can also be caused by the direct contact of the integrated circuit to the sensor.

Also, both Hamilton and Jones disclose testing sockets utilizing a threaded attachment of the heating and sensor elements to the testing socket.

Thus, it would be advantageous to have a testing socket with the sensor, heater (or cooler), and controller integrated into a single module and it would be advantageous for the testing socket to utilize a quickly releasable means to secure the module against the IC.

SUMMARY OF THE INVENTION

One aspect of the invention is a novel modular unit that may be used for burn-in, testing, and other process procedures of integrated circuit (IC) packages and the like. The modular unit has an arrangement of a heater (or cooler), an IC temperature sensor, and a controller fully contained within the modular unit.

This arrangement can be achieved by embedding a microprocessor controller within a modularized heater/sensor/controller unit. The embedded microprocessor controller acts as the controller, responding to the temperature sensor and driving the heater (or cooler).

In another aspect of the invention, the microprocessor controller can utilize an analog-to-digital converter to convert data from the temperature sensor and compare the converted digital data to digital information that represents a selected temperature.

In a further aspect of the invention, the testing socket can include latches on the socket for quickly releasing the heater/sensor/controller unit from the testing socket base.

Another aspect of the invention is a system for testing IC packages including testing sockets on testing boards within a testing chamber, wherein each testing socket has a heater, IC temperature sensor, and controller contained within a modularized unit. The system can include a terminal in communication with the testing boards for inputting a selected temperature for each testing socket.

Another aspect of the invention is a testing board with a matrix of testing socket bases and a top attach plate with a corresponding matrix of self-contained heater/sensor/controller units that connect to corresponding testing socket bases when the top attach plate is secured to the testing board. The units are independently spring-loaded on the top attach plate to allow for warping of the testing board.

Another aspect of the invention is a temperature sensing device located in a heater or cooler that has a temperature sensor positioned within a sensor housing with the sensor housing contacting the IC package. The sensor and sensor housing are thermally insulated from heater or cooler by a thermal insulator surrounding the sensor housing. The sensor housing provides a short thermal path between the IC package and the sensor.

The foregoing and other objects, features, and advantages of the various embodiments of invention will become more readily apparent from the following detailed description of a preferred embodiment of the invention which proceeds with reference to the accompanying drawings.

DETAILED DESCRIPTION

A. IC Package Temperature Controlling Device and Method

Figure 1:
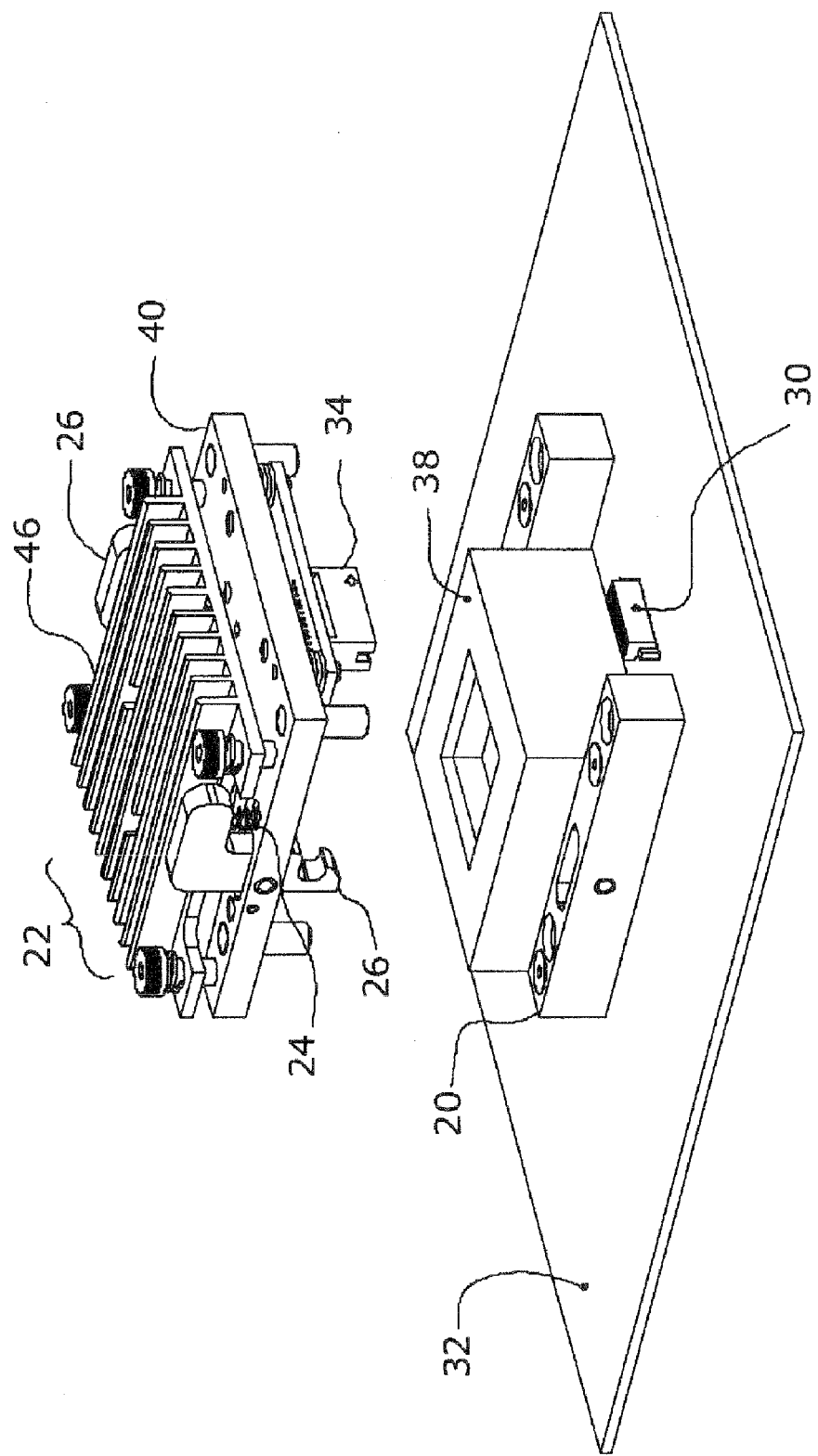
FIG. 1 is an exploded perspective view of a testing socket and modular sensor/heater/controller unit according to an embodiment of the invention.
Figure 2:
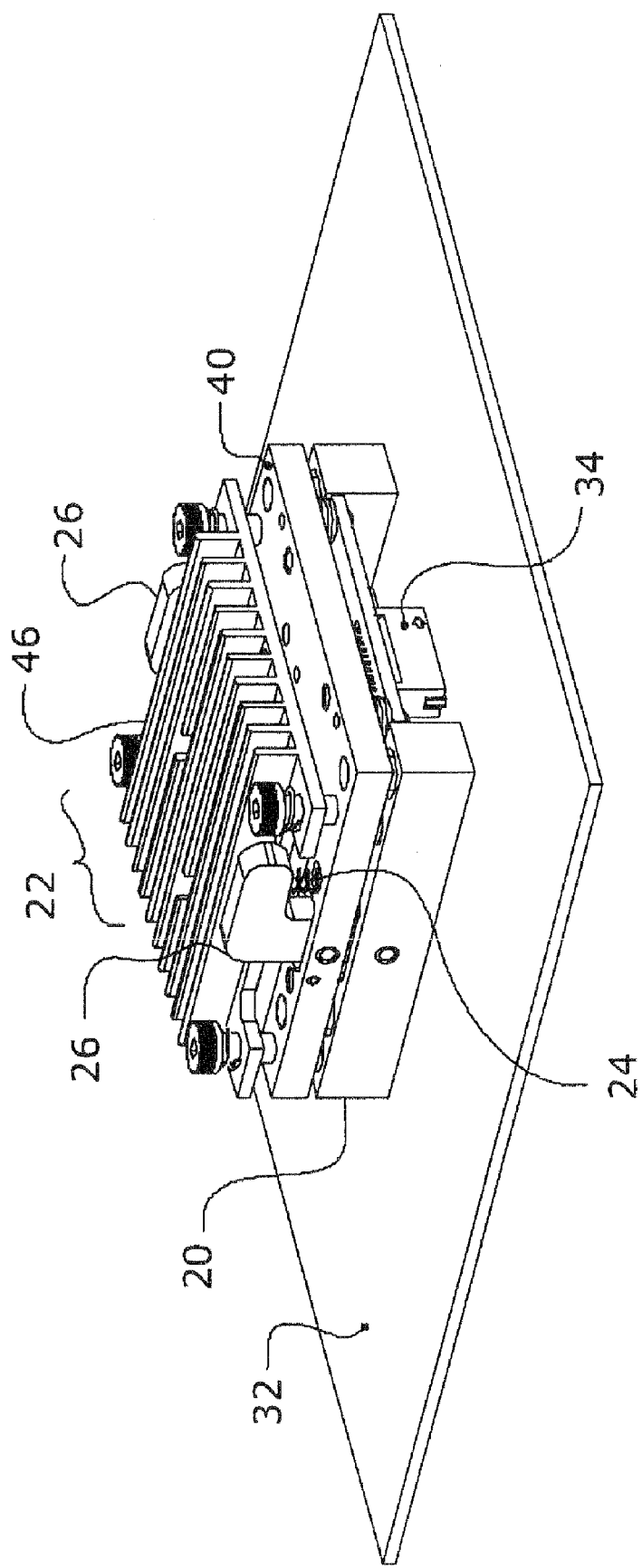
FIG. 2 is a perspective view of the testing socket and modular sensor/heater/controller unit of FIG. 1 in a latched position.

FIGS. 1 and 2 show perspective views of a testing socket 20 and a modular sensor/heater/controller unit 22 according to an embodiment of the invention. The heater can also be a cooler but hereinafter for simplification will only be referred to as a heater. Springs 24 on latch 26 allow for easy and quick release of the heater unit 22 from the testing socket base 38. FIG. 2 shows the testing socket 20 and modular unit 22 in a closed position where board-side connector 30 located on the testing board 32 receives communication/power connector 34 located on the heater unit 22.

Figure 3:
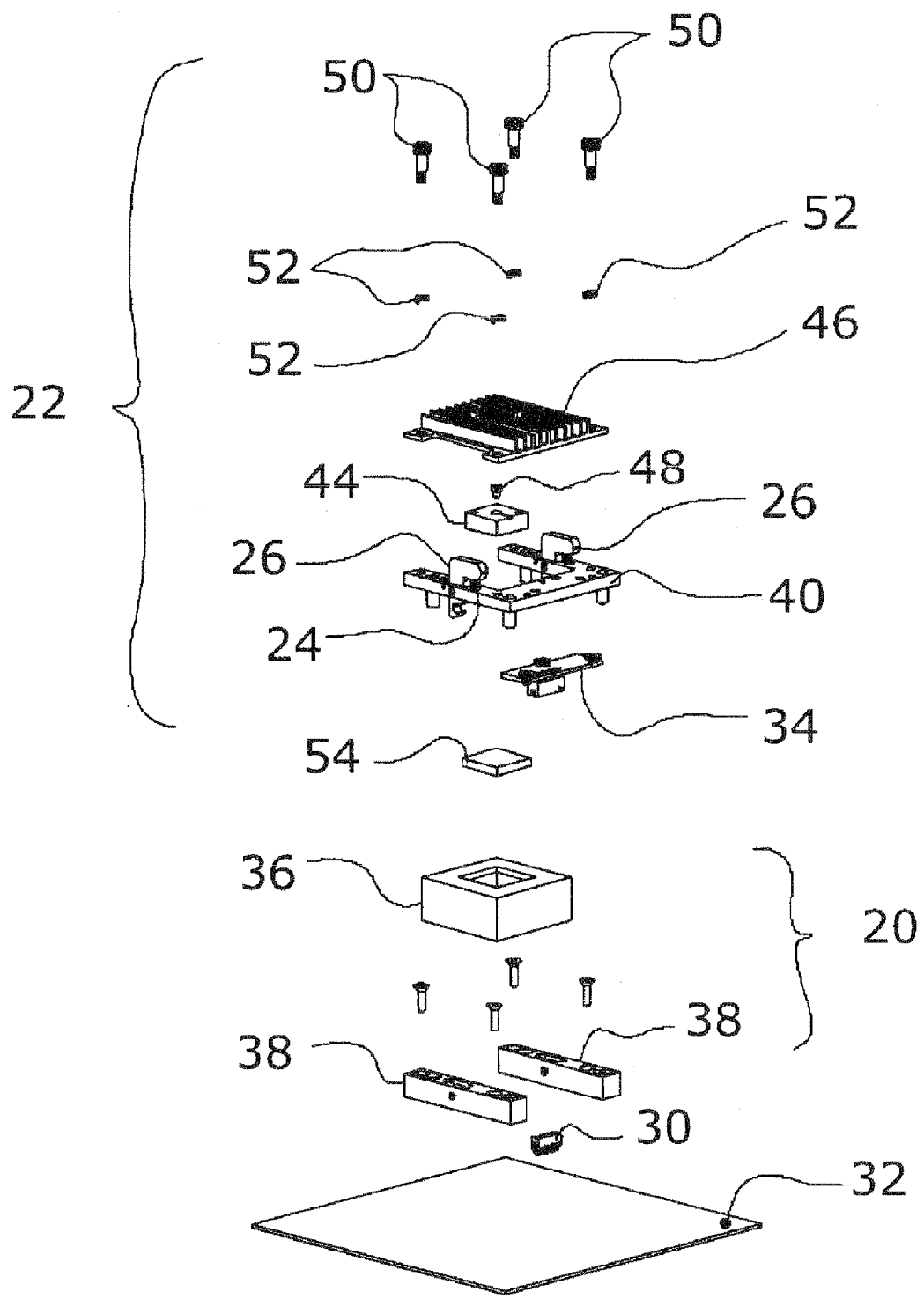
FIG. 3 is an exploded perspective view of the testing socket of FIG. 1.

FIG. 3 shows an exploded perspective view of the testing socket 20, modular unit 22, and testing board 32. The testing socket 20 utilizes a generic open-top socket 36 that is secured to base 38 and base 38 has alignment pins 41 and two latches 26. The modular unit 22 has a guide plate 40 for aligning the modular unit 22 onto the base 38 and board-side connector 30. Microprocessor controller 42 (shown in FIG. 5) is embedded within the guide plate 40 near the communication/power connector 34 or mounted on a top attach plate 72 (see FIGS. 8-9) as described below. The communication/power connector 34 is located on a bottom surface of the guide plate 40. The heater 44 connects flushly with a bottom surface of heat sink 46 and electrically communicates with the embedded microprocessor controller 42 for signal communication and electrically communicates with the communication/power connector 34 for power. The temperature sensor 48 (see FIG. 4) is positioned within heater 44 and also communicates with the microprocessor controller 42 for signal communication and the communication/power connector 34 for power. The heat sink 46, that has the heater 44 and sensor 48 connected to its bottom surface, attaches to the guide plate 40 with a combination of barrel screws 50 and springs 52. The combination provides a controlled force of the heater 44 and sensor 48 against an IC package 54 in open-top socket 36 when the testing socket 20 and modular unit 22 are in a closed position.

Figure 4:
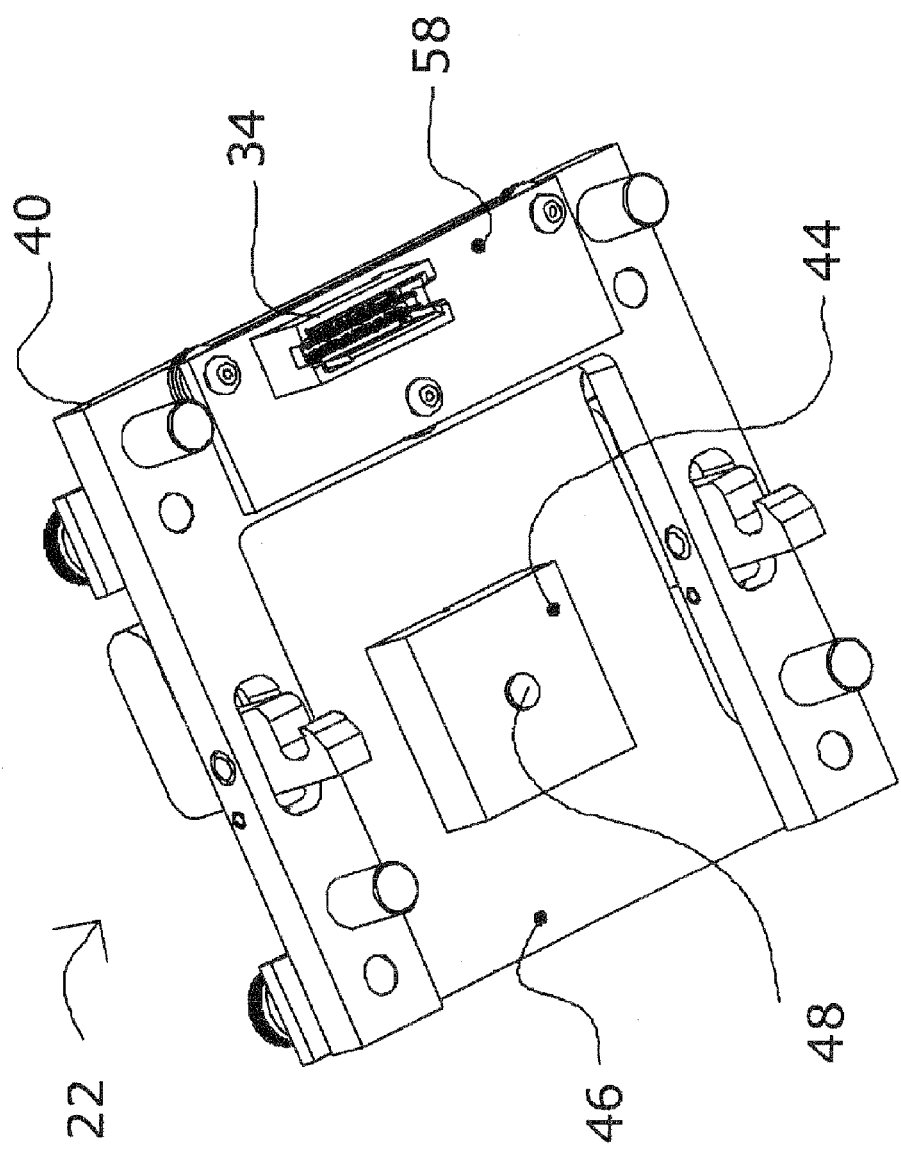
FIG. 4 is a perspective view of the modular sensor/heater/controller unit of the testing socket of FIG. 1 showing the heater, sensor and data communication connector.

FIG. 4 shows a bottom side of the modular sensor/heater/controller unit 22 of FIG. 1. The sensor 48 is located within a cavity in the heater 44 and is electrically connected to the embedded microprocessor controller 42 (not shown) located within the controller casing 58 on guide plate 40. Communication/power connector 34 is located on the controller casing 58 and communicates with the microprocessor controller 42. The heater 44 is flushly connected with the bottom surface of heat sink 46 to provide effective heat transfer between the two through thermal conduction.

Figure 5:
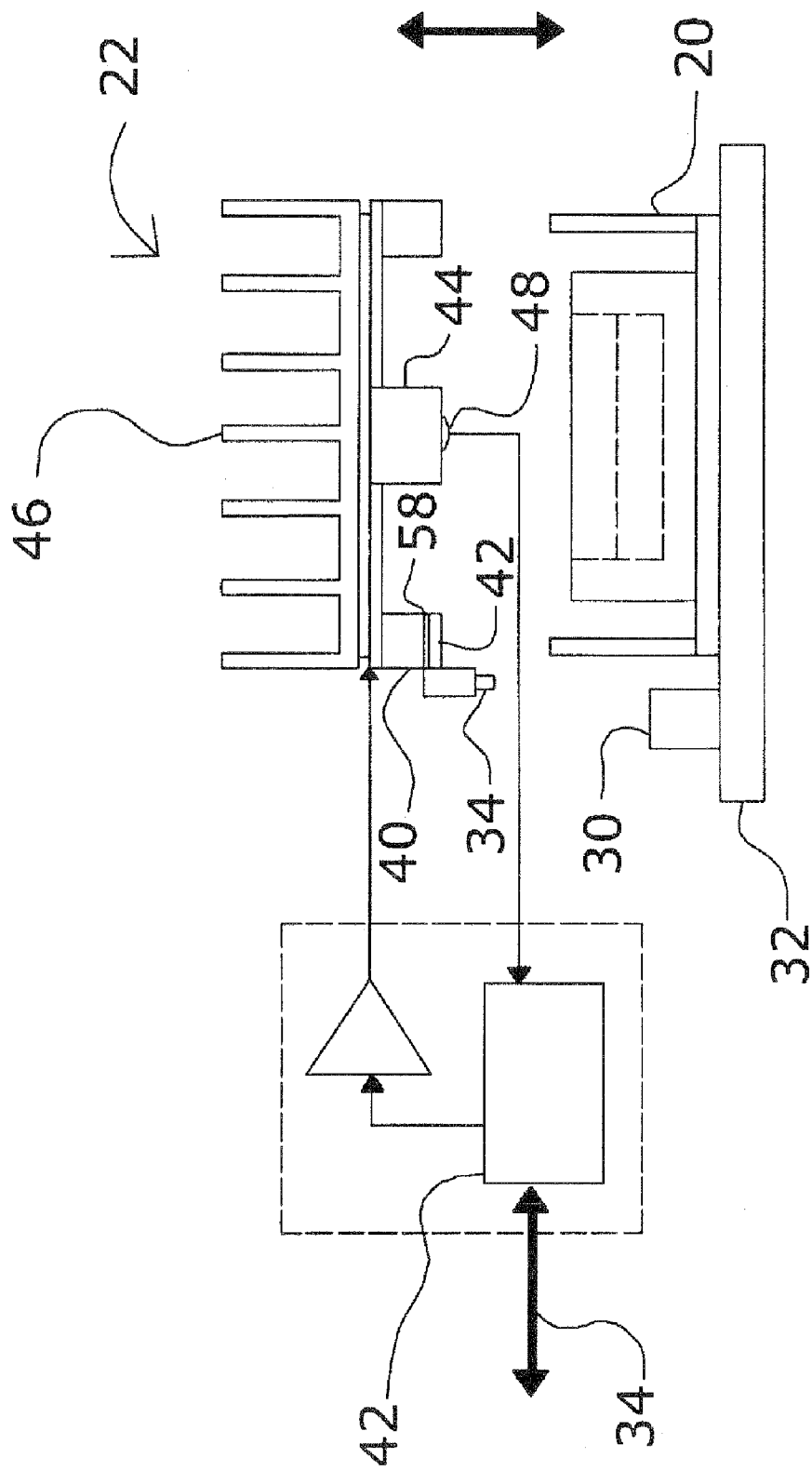
FIG. 5 is a simplified layout elevation view of the testing socket of FIG. 1 including a block diagram of the sensor/heater/controller/communication circuit.

FIG. 5 shows a simplified layout elevation view of the testing socket 20 and modular unit 22 of FIG. 1 located on a testing board 32. FIG. 5 includes a simple circuit diagram showing the microprocessor controller 42 in communication with the sensor 48 and the heater 44. The microprocessor controller 42 receives data via the communication/power plug 34 that connects to the board-side socket 30. The heater 44, microprocessor 42, and sensor 48 receive power via the communication/power connector 34. The microprocessor controller 42 is embedded within the modular unit 22. By embedding the microprocessor controller 42 within the modular unit 22, the modular unit 22 acts as a single, modularized sensor/heater/controller unit. This allows for the advantage of testing this system as a single unit as opposed to testing for faults in each of the components or in the communication links between the components. During testing, if a modular unit 22 fails, the whole unit is simply and quickly replaced with a functioning unit.

Figure 6:
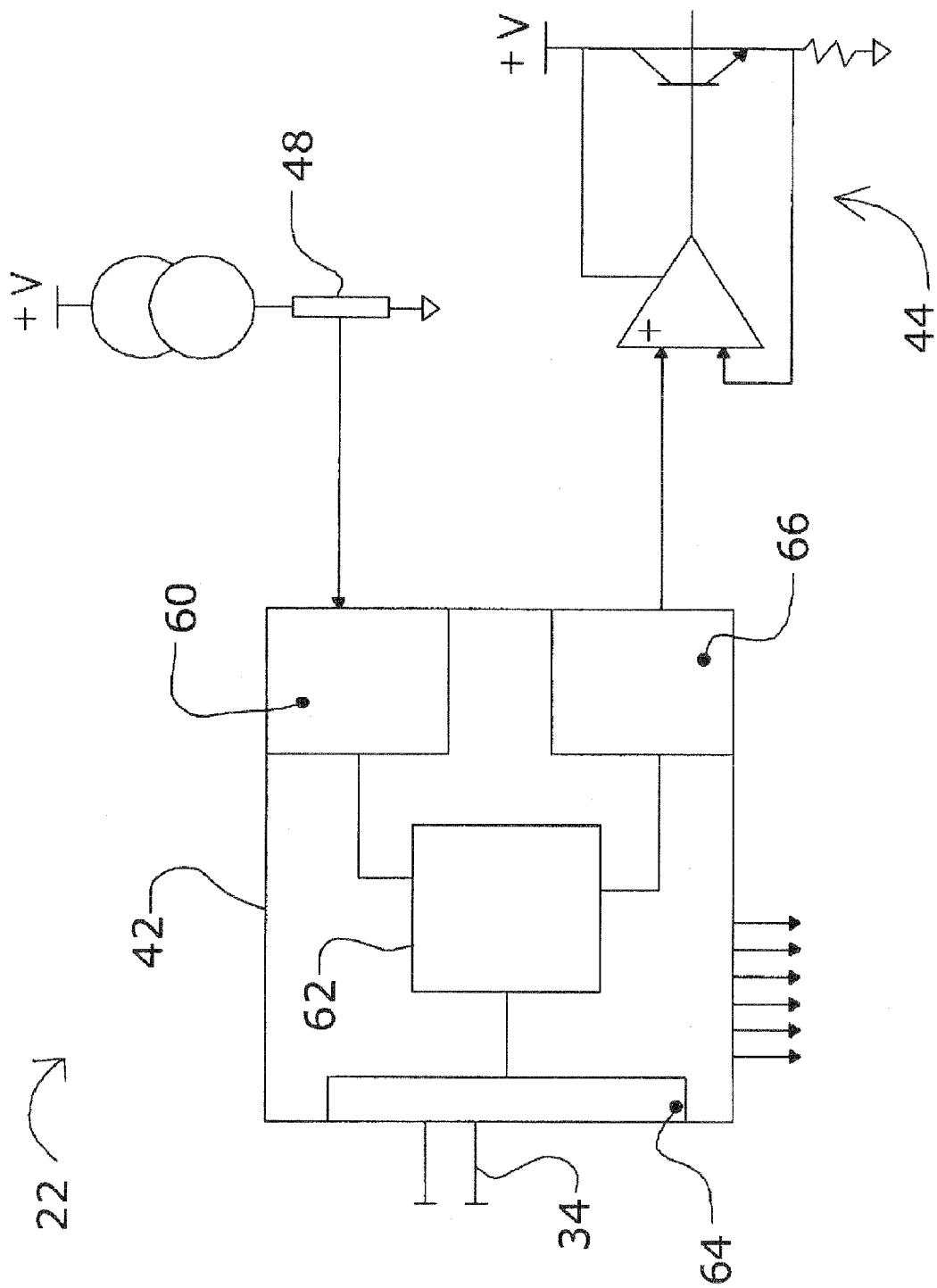
FIG. 6 is a circuit diagram of the sensor/heater/controller unit of the testing socket of FIG. 1.

FIG. 6 shows a circuit diagram of the modular unit 22. The sensor 48 is shown as a thermistor being supplied with a constant current. The voltage of the thermistor 48 is converted into digital form by Analog-to-Digital (A/D) converter 60 within the microprocessor controller 42. The digital data from the A/D converter 60 is compared to a user-selected temperature expressed in digital form in processor 62. The user-selected temperature is inputted into the processor 62 via the communications portion 64 of the microprocessor controller 42. The communications portion 64 is in communication with the signal lines in the power/communication connector 34. The processor 62 then sends a digital signal to the Digital-to-Analog (D/A) converter 66 within the microprocessor controller 42. An analog signal from the D/A converter 66 is sent to an amplifier coupled to the heater 44 to control the amount of heat being dissipated by the heater 44. Heater 44 can also be a cooler with microprocessor 42 similarly driving the cooler.

Figure 7:
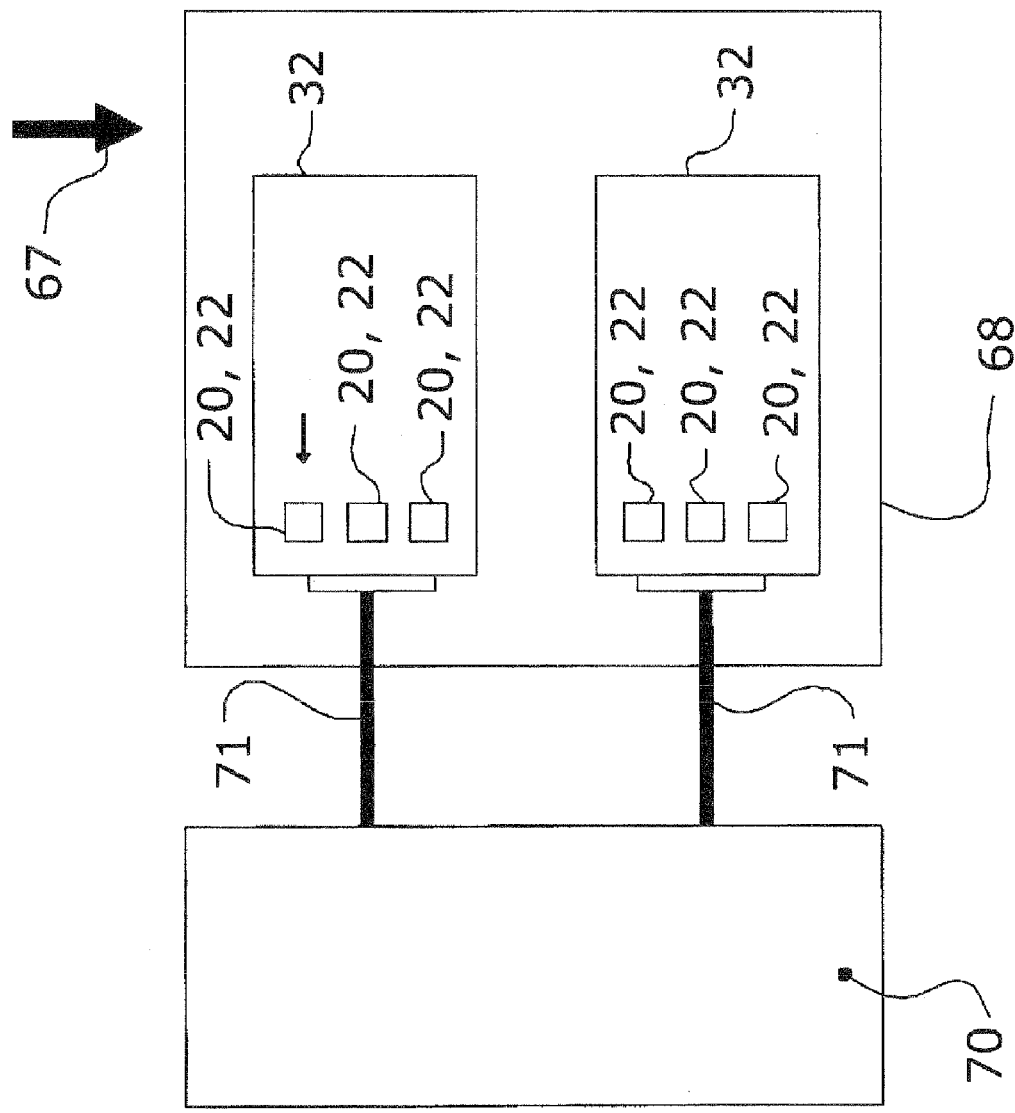
FIG. 7 is block plan view of a system of multiple testing sockets on Burn-in-Boards in a Burn-in chamber according to another embodiment of the invention.

FIG. 7 shows a simplified plan view of a system of testing boards 32 within a testing or burn-in chamber 68 according to another embodiment of the invention. A matrix of testing sockets 20 and modular units 22 are located on each testing board 32. The testing boards 32 are in communication with an outside power source and driver electronics 70. The power source and driver 70 communicates with the testing boards 32 preferably by means of an J2C data stream on a data bus which is included in a data/power bus 71. The power source and driver electronics 70 serves as a system controller which allows a user to determine a desired testing temperature for each IC package 54.

A typical testing chamber 68 is a burn-in chamber where air flow 67 from a fan or some other source is maintained across the testing boards 32. The air flow 67 is preferably maintained at a high enough rate to keep the IC packages below the selected temperature prior to application of heat from the individual heaters 44. The heaters 44 can then more easily maintain independently selected temperature of each IC package 54.

Figure 8:
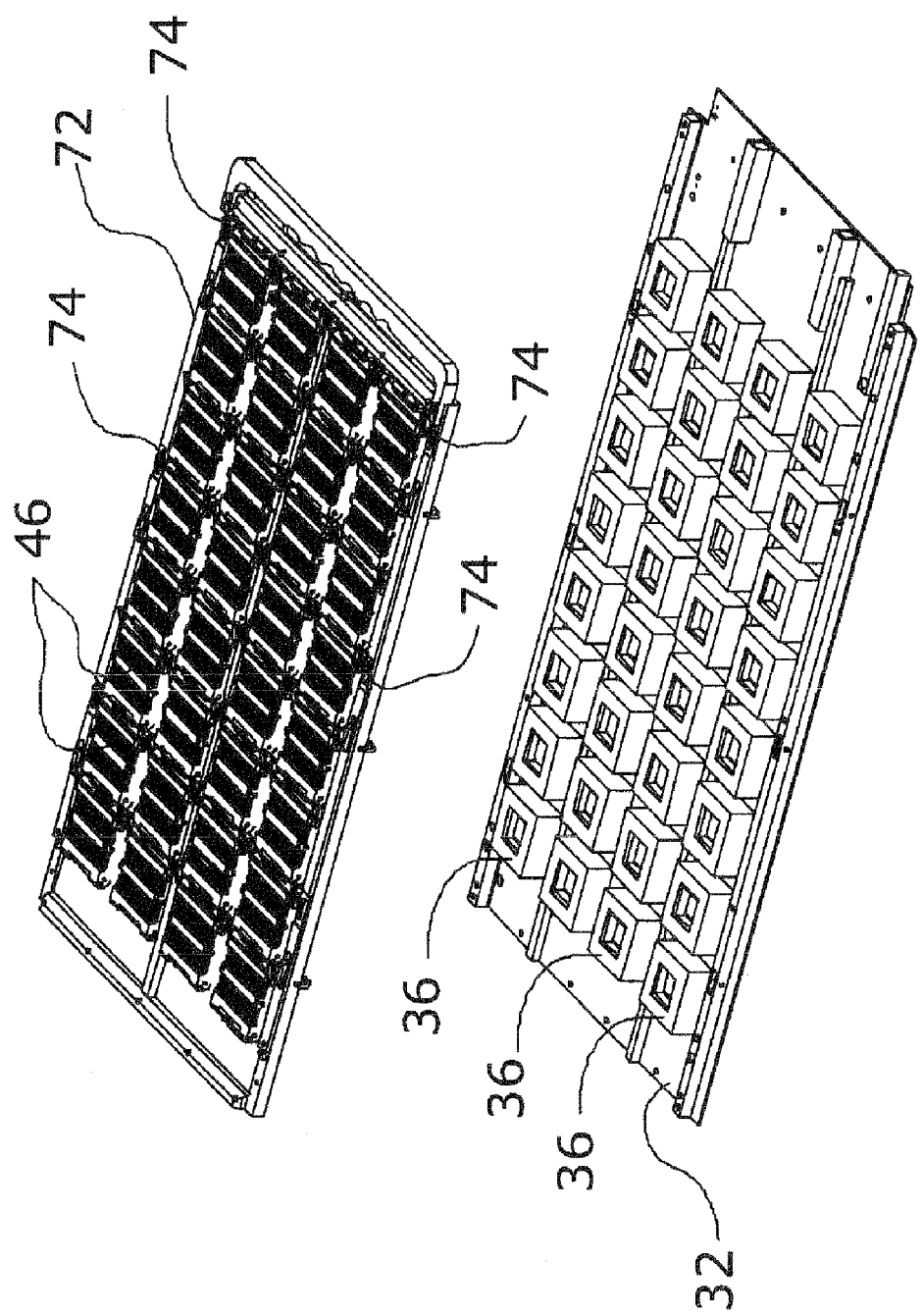
FIG. 8 is a perspective view of multiple testing sockets on a testing board showing multiple sensor/heater/controller units positioned on a single top attach plate according to another embodiment of the invention.

FIG. 8 shows a perspective view of another embodiment of the invention in which a plurality of modular heaters 44, temperature sensors 48 and heat sinks 46 are attached to a single top attach plate 72, preferably arranged in a regular matrix. Each modular unit 22 is individually spring-loaded on the top attach plate 72 to allow for any warping of the testing board 32. The top attach plate 72 is positioned over multiple open-top sockets 36 on a testing board 32.

The top attach plate 72 connects to the testing board 32 with fasteners 74 along the edges of the top attach plate 72 and testing board 32. Multiple fasteners 74 are used to secure the top attach plate so as to engage the temperature sensors 48 and heaters 44 with the IC packages 54 located in the open-top sockets 36.

Figure 9:
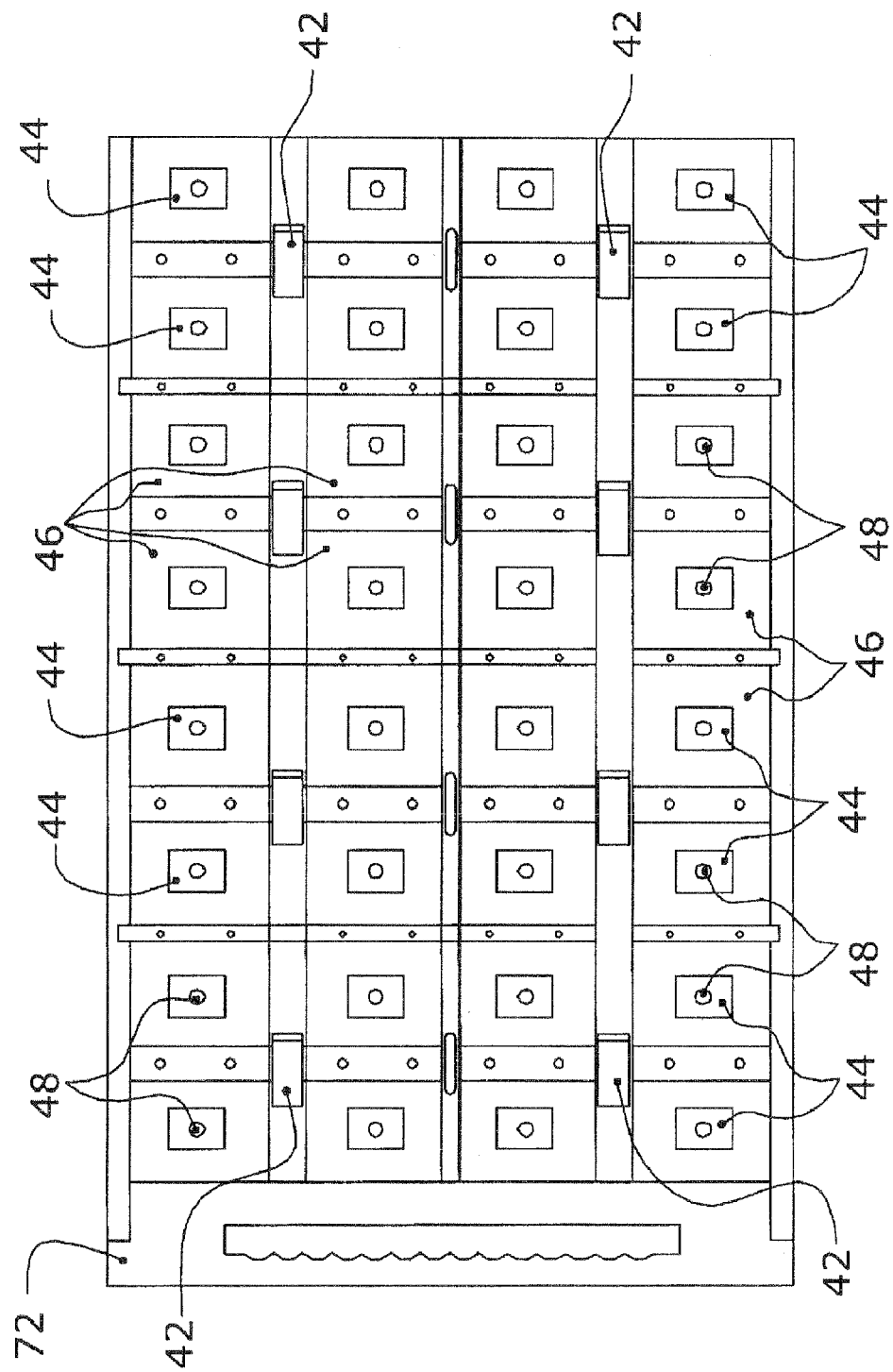
FIG. 9 is to plan view of the bottom side of the top attach plate of FIG. 8.

FIG. 9 shows a plan view of the bottom side of the top attach plate 72. Here, the top attach plate 72 is arranged to incorporate the structure of what would be an array of guide plates 40 (See FIG. 3) instead of having discrete guide plates 40. A plurality of heaters 44 and corresponding temperature sensors 48 are arranged in a regular matrix on a plurality of corresponding heat sinks 46. Electronic controllers 42 are electrically connected to the heaters 44 and temperature sensors 48. Power may be supplied to the electronic controllers 42, heaters 44 and temperature sensors 48 through a signal/power bus 71 (see FIG. 7) that connects to the top attach plate 72 or the testing board 32.

This embodiment allows for easy and quick placement and removal of IC packages 54 into and out of the separate testing sockets 20. Rather than individually securing each modular unit 22 to each open-top socket 36, the top attach plate 72 allows for securing all of the modular units 22 with four corner fasteners 74.

In FIG. 9, each electronic controller 42 is connected to a subset of four temperature sensors 48 and heaters 44. The controller 42 may receive digital values from the system controller (see FIG. 7), which each digital value representing a desired IC package 54 temperature. For example, a controller 42 may receive four digital values with each digital value representing a desired temperature for of each of the corresponding four IC packages 54 that the corresponding four temperature sensors 48 and heaters 44 engage.

A controller 42 may receive signals from each of the four temperature sensors 48. Then, responsive to a comparison of data converted from those signals with the transmitted signals from the system controller 70, the controller 42 transmits signals to each of the corresponding four heaters 44 to control each of those heaters 44 and thereby control the temperature of each of the four IC packages.

B. IC Package Temperature Sensing Device

Figure 11:
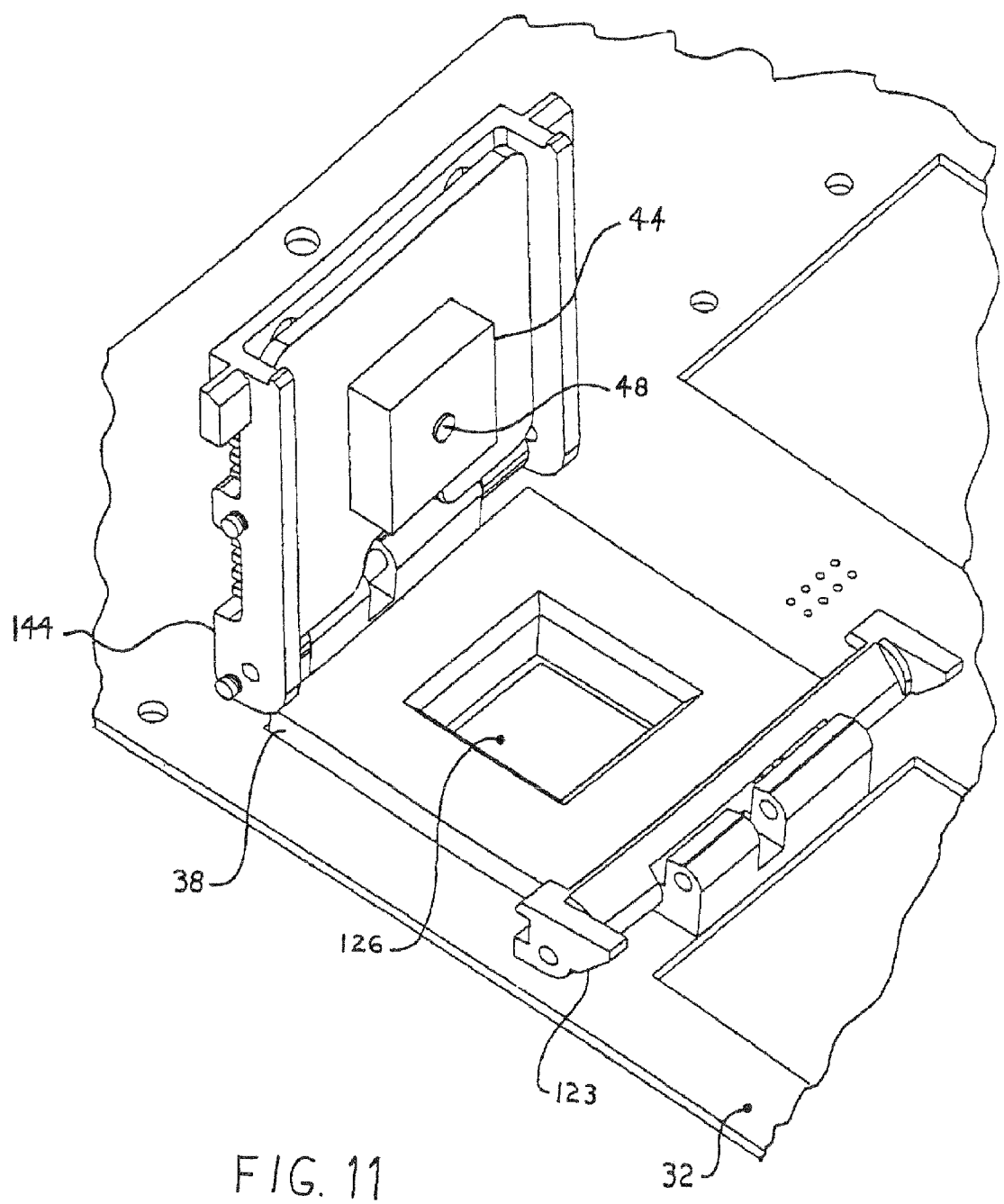
FIG. 11 is a perspective view of an integrated circuit testing socket with a temperature sensing device and integrated circuit according to the invention.

FIG. 11 shows an integrated circuit temperature sensing device 48 according to an embodiment of the invention in an integrated circuit testing socket 123. Integrated circuits include individual dies and IC packages and the term integrated circuit (IC) used throughout this specification encompasses all forms of integrated circuits. The testing socket 123 can be a socket designed to receive an IC 54 for testing which includes, burning-in, testing and programming of the IC 54.

Figure 10:
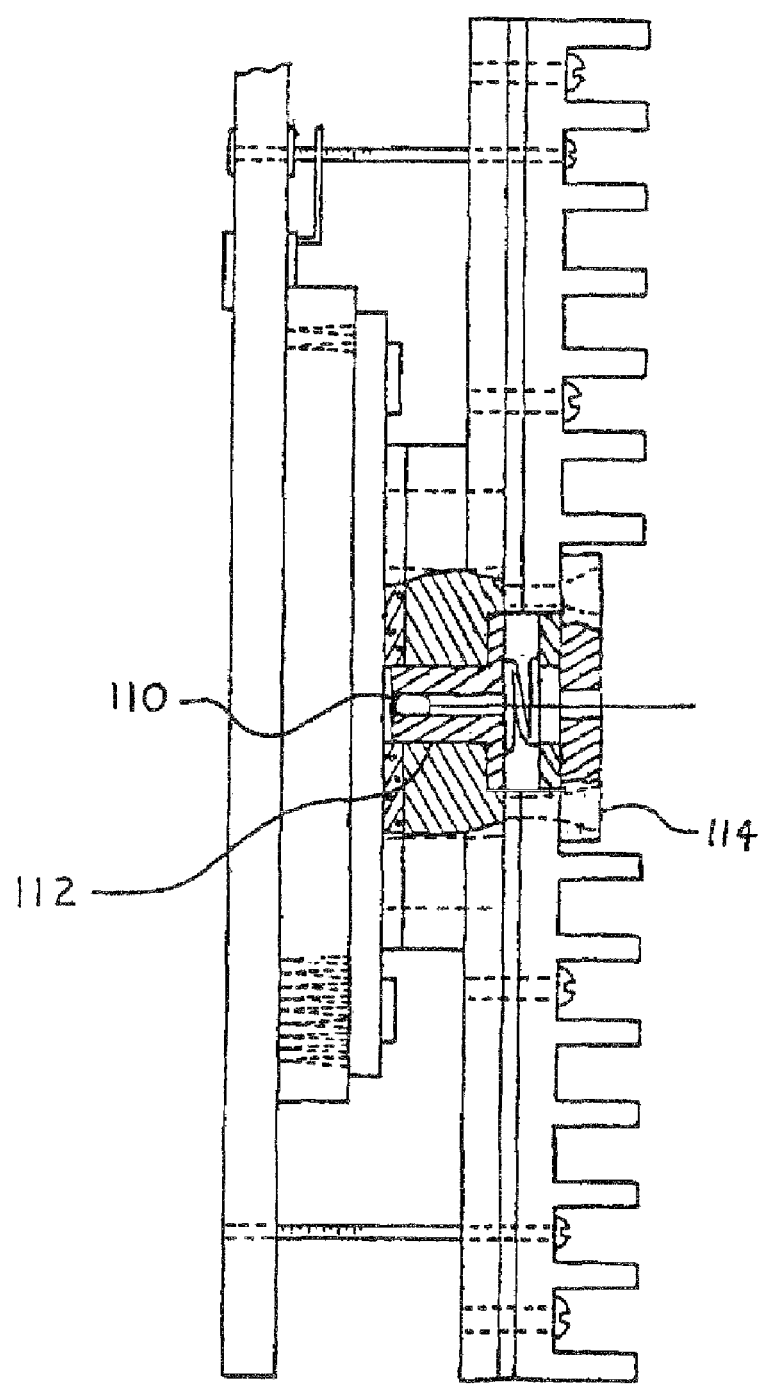
FIG. 10 is a side elevation view of a prior art integrated circuit testing socket.

The IC testing socket 123 includes temperature control block 44 for directly controlling the temperature of the IC 54 during testing. The IC testing socket 123 generally comprises a base 38 connected to a testing board 32 and a lid 144. The preferred form of IC testing socket 123 is described above in further detail. However, particulars of construction of the IC testing socket 123 are not necessary to this embodiment of the present invention and so need not be described further herein. For example, this embodiment of the present invention can be incorporated into other IC testing sockets such as described in U.S. Pat. No. 5,911,897 to Hamilton and shown in FIG. 10.

The temperature control block 44 is positioned in the lid 144 so that when the IC testing socket 123 is in a closed position, the temperature control block 44 thermally contacts the IC 54. The temperature control block 44 then effects a change in the temperature of the IC 54 by conducting heat to or from the IC 54. Thus, the temperature control block 44 can be a heater or a cooler.

The IC temperature sensing device 48 is shown located within the temperature control block 44 positioned so as to thermally contact the IC 54 when the IC testing socket 123 is in a closed position.

Figure 12:
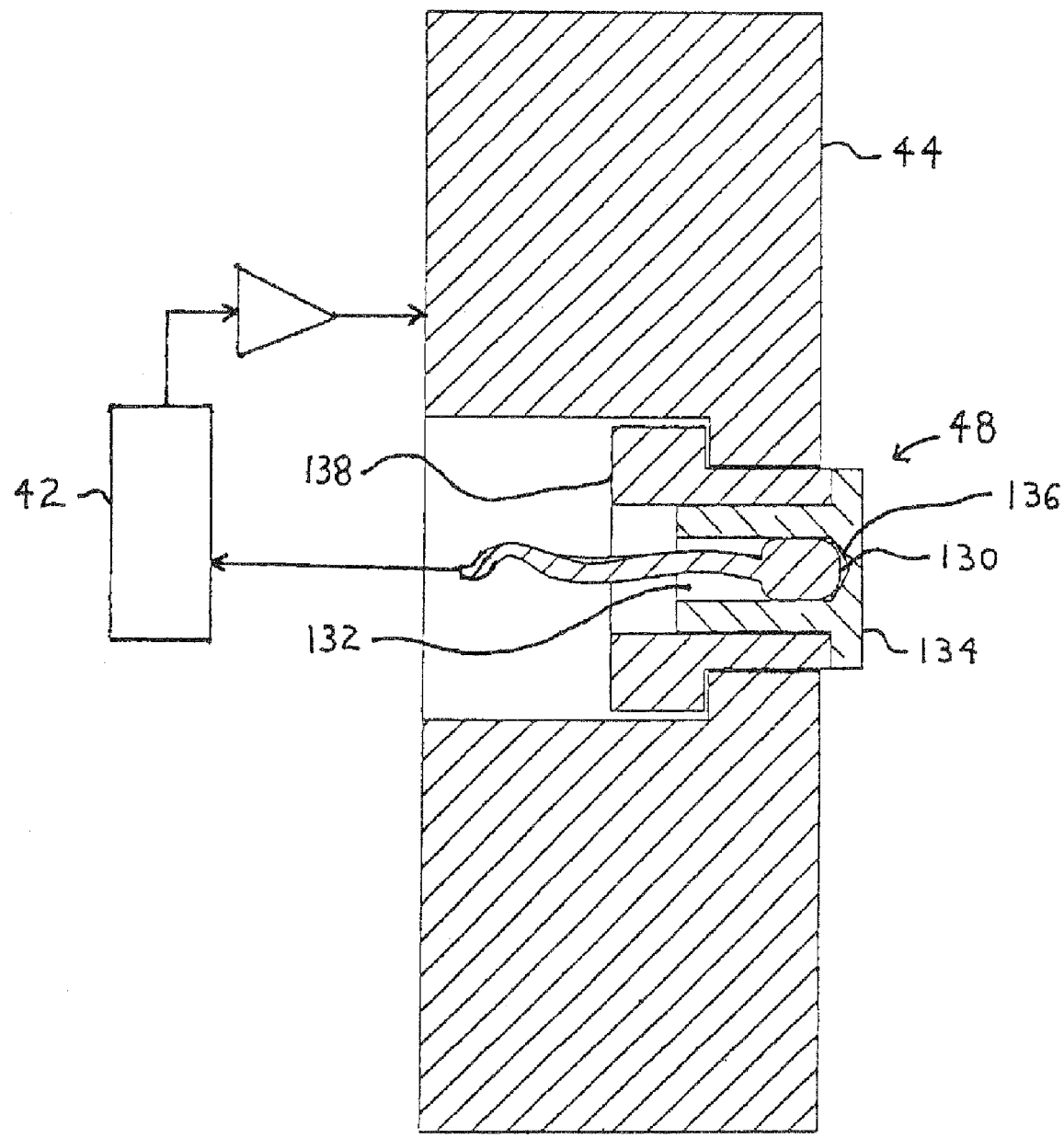
FIG. 12 is a partial cross-sectional view of a portion of the integrated circuit testing socket of FIG. 10 showing the temperature sensing device positioned in a temperature control block.
Figure 13:
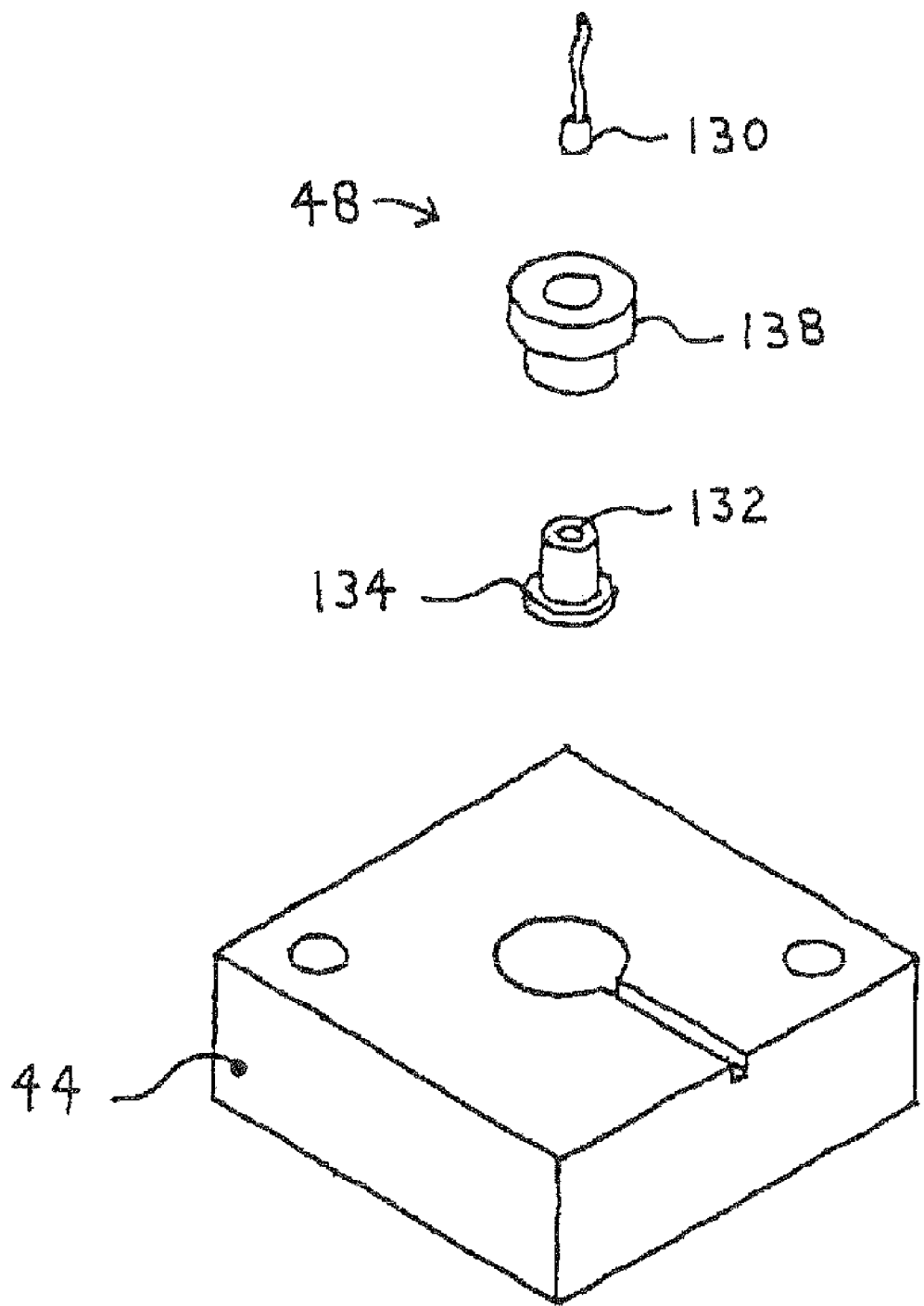
FIG. 13 is an exploded perspective view of the temperature sensing arrangement of FIG. 10.

FIG. 12 shows a partial cross-sectional view of the IC testing socket 123 of FIG. 11 showing the IC temperature sensing device 48 positioned within the temperature control block 44. FIG. 13 shows an exploded perspective view of the temperature sensing device 48.

Referring to FIGS. 12 and 13, the IC temperature sensing device 48 includes a temperature sensor 130, such as a thermistor, in electrical communication with devices capable of converting the temperature sensor signals into useable form. One such device can be a microprocessor controller 42 that acts as a controller, responding to the temperature sensor 130 and driving the temperature control block 44.

The temperature sensor 130 is positioned within a cavity 132 of the thermally conductive sensor housing 134. The cavity 132 is shown here as being cylindrical, reflecting the overall shape of the temperature sensing device 48. The cavity 132 has a single opening at a first end of the sensor housing 134 to allow the temperature sensor to be in communication with devices like a microprocessor controller or off-board controller. When the IC testing socket 123 is in a closed position, the sensor housing 134 is in thermal contact with the IC 54. Because the sensor housing 134 is thermally conductive, the sensor housing 134 is able to provide a thermally conductive path between the IC 54 and the temperature sensor 130.

The cavity 132 is formed as a blind bore which includes an open first end and a conically shaped termination 136 at a second end of the sensor housing 134. The conically shaped termination 136 has a thickness which allows for a short thermal path for a fast transient response from the IC 54 to the temperature sensor 130. A suitable thickness for producing the short thermal path is 3 mm when the sensor housing 134 is formed of a metal comprising copper or aluminum.

A thermal insulator 138 surrounds the sensor housing 134 to thermally isolate the temperature sensor 130 from the temperature control block 44. The second end of the sensor housing 134 is exposed from the thermal insulator 138 to allow the sensor housing 134 to thermally contact the IC 54 when the IC testing socket 123 is in a closed position.

The sensor housing 134 provides both a thermally conductive path from the IC 54 to the temperature sensor 130 and protection from impact or problems related to point contact pressures that could occur if the IC 54 directly, physically contacted the temperature sensor 130. The sensor housing 134 protects the temperature sensor 130 by providing a protective layer of material that intervenes between the IC 54 and the temperature sensor 130. The sensor housing 134 protects the IC 54 from point contact pressures that could be cause by directly contacting a temperature sensor 130 by providing a larger, substantially flatter contact surface area than the small temperature sensor 130 can provide.

For the most accurate results in sensing the temperature of an IC 54 during testing, the sensor housing 134 should be formed a highly conductive metal. Most preferably, the sensor housing 134 is formed of a metal comprising aluminum or copper. Also, to increase accuracy, the thermal insulator 138 should adequately thermally isolate the temperature sensor 130 and sensor housing 134 from the temperature control block 44 so that the temperature sensor 130 is predominantly sensing the temperature of the IC 54 and not the temperature control block 44. To achieve thermal isolation, the thermal insulator 138 is most preferably formed of a polythermide material. Ultem 1000®, manufactured by General Electric, is an example of a preferable polythermide material.

C. IC Package Temperature Sensing Method

A method for sensing the temperature of an IC 54 being tested includes placing the IC 54 in an IC testing socket 123. The temperature of the integrated circuit is changed by thermally contacting a heater or cooler 44 to the integrated circuit. This is chiefly done in the burning-in process for ICs but the temperature of the IC 54 can also be controlled for programming and testing of the IC 54.

The temperature of the IC 54 is then sensed by means of a temperature sensor device 48 contained within the heater or cooler 44. The temperature sensor device 48 senses the temperature of the IC 54 by thermally connecting a temperature sensor 130 to the IC 54 through a conductive material 134 and by thermally isolating the temperature sensor 130 from the heater or cooler 44 with a surrounding insulating material 138 so that the temperature sensor 130 predominantly senses the temperature of the IC 54 and not the heater or cooler 44.

The conductive material 134 spaces the temperature sensor 130 from the IC 54 such that a thermal path between the IC 54 and temperature sensor 130 is maintained to create a fast transient response in the temperature sensor 130.

The temperature sensor 130 is thermally isolated from the heater or cooler 44 by positioning the temperature sensor 130 within a thermally conductive sensor housing 134 that is surrounded by thermally insulating material 138 such that first and second ends of the sensor housing 134 are exposed. The sensor housing 134 and thermally insulating material 138 are then positioned within an appropriately sized and shaped opening in the heater or cooler 44 so that the thermally conductive housing 134 can be in thermal contact with the IC 54.

Having described and illustrated the principles of the invention in a preferred embodiment thereof, it should be apparent that the invention can be modified in arrangement and detail without departing from such principles.

The invention claimed is:

1. An integrated circuit (IC) socket lid, comprising:
a temperature sensor arranged to thermally contact an IC package;
a heater or a cooler arranged to directly contact the IC package;
a sensor housing containing the temperature sensor and composed of a thermally conductive material to physically contact the IC package and to physically isolate the temperature sensor from the IC package;
an insulating material surrounding the sensor housing to thermally isolate the temperature sensor from the heater or a cooler;
an electronic controller embedded within the IC socket lid and connected to the temperature sensor and to the heater or cooler, wherein the electronic controller is programmed to control the temperature of the IC package responsive to the temperature sensor; and
the sensor housing having a blind bore having an end adjacent to the IC package, in which the temperature sensor is contained.

2. The IC socket lid of claim 1, further comprising a latch adapted to quickly secure and release the lid to and from an IC socket base.

3. The IC socket lid of claim 1, wherein the electronic controller includes:
an analog-to-digital (A/D) converter to convert signals from the temperature sensor;
a processor programmed to receive and transmit digital data; and
a digital-to-analog (D/A) converter to convert digital data from the processor, wherein the processor is programmed to compare the converted data from the temperature signal with an operator inputted digital value and, responsive to the comparison, transmit a signal from the processor through the D/A converter to the heater or cooler to affect the temperature of the IC package.

4. The IC socket lid of claim 1, further comprising an electrical connector electrically coupled to the electronic controller and arranged to connect with a corresponding electrical connector on a testing board.

5. The IC socket lid of claim 4, wherein:
the electronic controller is adapted to receive digital signals and power from the electrical connector;
the heater or cooler is adapted to receive power from the electrical connector; and
the temperature sensor is adapted to receive power from the electrical connector.

6. The IC socket lid of claim 1, wherein the temperature sensor includes a thermistor positioned within the sensor housing so as to be physically isolated from the IC package, but thermally coupled to the IC package via the sensor housing.

7. A system for testing, burning-in and programming IC packages including an IC socket lid according to claim 1, further comprising:
a testing chamber;
a testing board placed within the testing chamber;
an IC socket base mounted on the testing board;
an IC package received in the IC socket base.

8. An integrated circuit (IC) socket lid, comprising:
a temperature sensor arranged to thermally contact an IC package;
a heater or a cooler arranged to directly contact the IC package;

a sensor housing containing the temperature sensor and composed of a thermally conductive material to physically contact the IC package and to physically isolate the temperature sensor from the IC package;

an insulating material surrounding the sensor housing to thermally isolate the temperature sensor from the heater or a cooler; and an electronic controller embedded within the IC socket lid and connected to the temperature sensor and to the heater or cooler, wherein the electronic controller is programmed to control the temperature of the IC package responsive to the temperature sensor;

wherein the thermally conductive material is shaped to provide a flat surface that contacts the IC package over an area greater than an area of the temperature sensor.

9. An integrated circuit (IC) socket lid, comprising:

a temperature sensor arranged to thermally contact an IC package;

a heater or a cooler arranged to directly contact the IC package;

a sensor housing containing the temperature sensor and composed of a thermally conductive material to physically contact the IC package and to physically isolate the temperature sensor from the IC package;

an insulating material surrounding the sensor housing to thermally isolate the temperature sensor from the heater or a cooler; and an electronic controller embedded within the IC socket lid and connected to the temperature sensor and to the heater or cooler, wherein the electronic controller is programmed to control the temperature of the IC package responsive to the temperature sensor;

wherein the insulating material is formed of a polythermide material.

10. A system for testing, burning-in and programming IC packages, comprising:

a testing board;

an IC socket base mounted on the testing board arranged to receive an IC package; and an IC socket lid, the lid comprising:

a temperature sensor arranged to thermally contact an IC package;

a heater or a cooler arranged to directly contact the IC package;

a sensor housing containing the temperature sensor and composed of a thermally conductive material to physically contact the IC package and to physically isolate the temperature sensor from the IC package;

an insulating material surrounding the sensor housing to thermally isolate the temperature sensor from the heater or a cooler; and an electronic controller embedded within the IC socket lid and connected to the temperature sensor and to the heater or cooler, wherein the electronic controller is programmed to control the temperature of the IC package responsive to the temperature sensor;

the IC socket base including a plurality of IC socket bases mounted on the testing board for receiving a plurality of IC packages;

the temperature sensor including a plurality of temperature sensors arranged to thermally contact each of the plurality of IC packages in the plurality of IC socket bases;

the heater or cooler including a plurality of heaters or coolers arranged to directly contact each of the plurality of IC packages;

the electronic controller including a plurality of electronic controllers; and the IC socket lid including a top attach plate adapted to attach to the testing board.

11. The system of claim 10, in which the plurality of IC socket bases and the plurality of temperature sensors and heaters or coolers are arranged in a regular matrix.

12. A method of controlling the temperature of an integrated circuit (IC) package during one of testing, burning-in, and programming of the IC package, comprising:

sensing a temperature of the IC package with a temperature sensor in thermal contact with the IC package, the temperature sensor being located in an IC socket lid, the temperature sensor further being included in a sensor housing composed of a thermally conductive material to physically contact the IC package and to physically isolate the temperature sensor from the IC package; and an insulating material surrounding the sensor housing to thermally isolate the temperature sensor from a heater or cooler located in the IC socket lid; and processing data from the temperature sensor in an electronic controller located in the IC socket lid; and controlling the temperature of the IC package with the heater or cooler responsive to a signal from the electronic controller;

the sensor housing having a blind bore having an end adjacent to the IC package, in which the temperature sensor is contained.

13. The method of claim 12, further comprising transmitting a digital signal to the electronic controller from a system controller, the digital signal representing a desired IC package temperature.

14. The method of claim 13, further comprising:

comparing the transmitted digital signal representing the desired IC package temperature with the sensed temperature of the IC package in the electronic controller; and transmitting a signal responsive to the comparison from the electronic controller to the heater or cooler to control the heater or the cooler.

15. The IC socket lid of claim 12, wherein the thermally conductive material is shaped to provide a flat surface that contacts the IC package over an area greater than an area of the temperature sensor.

16. The IC socket lid of claim 12, wherein the insulating material is formed of a polythermide material.

* * * * *